United States Patent
Gao

(10) Patent No.: US 11,980,006 B2
(45) Date of Patent: May 7, 2024

(54) LEAK SEGREGATION AND DETECTION SYSTEM FOR AN ELECTRONICS RACK

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 141 days.

(21) Appl. No.: 17/464,221

(22) Filed: Sep. 1, 2021

(65) Prior Publication Data
US 2023/0066006 A1  Mar. 2, 2023

(51) Int. Cl.
H05K 7/20 (2006.01)
(52) U.S. Cl.
CPC ..... *H05K 7/20272* (2013.01); *H05K 7/20254* (2013.01); *H05K 7/20781* (2013.01)
(58) Field of Classification Search
None
See application file for complete search history.

(56) References Cited

U.S. PATENT DOCUMENTS

| | | | | |
|---|---|---|---|---|
| 10,098,258 B2 * | 10/2018 | Chainer | ............ | H05K 7/20781 |
| 11,310,938 B2 * | 4/2022 | Su | .......... | G01M 3/183 |
| 11,490,546 B2 * | 11/2022 | Edmunds | ........... | H05K 7/20772 |
| 2011/0313576 A1 * | 12/2011 | Nicewonger | ...... | H05K 7/20781 |
| | | | | 361/701 |
| 2022/0046828 A1 * | 2/2022 | Miyamura | ......... | H05K 7/20763 |
| 2022/0312645 A1 * | 9/2022 | Gao | ........................ | G06F 1/206 |

* cited by examiner

*Primary Examiner* — Courtney L Smith
(74) *Attorney, Agent, or Firm* — WOMBLE BOND DICKINSON (US) LLP

(57) ABSTRACT

According to one embodiment, a system for a rack includes an equipment module for coupling to a rack module. The rack module includes a pair of main connectors for coupling to a coolant source and a pair of manifold connectors, and includes a vertical leak detection channel that has a leak detection cable. Positioned between the main connectors and the manifold connectors is a structure that at least partially contains the main connectors and has a liquid path to the channel. The equipment module includes a chassis that has a pair of connectors and a conducting path. The chassis also has an opening for receiving the manifold connectors for coupling to the connectors, and another opening, the conducting path extends from an interior of the chassis to the other opening and is arranged to guide liquid out of the opening and into the channel while both modules are coupled together.

19 Claims, 9 Drawing Sheets

LEAK SEGREGATION AND DETECTION SYSTEM FOR AN ELECTRONICS RACK

FIELD

Embodiments of the present disclosure relate generally to an electronics rack that includes a leak segregation and detection system.

BACKGROUND

Recently, data centers have been deploying more high-power density electronics racks, where more high-density chips are packaged closer together to provide more processing power. This is especially the case due to developments in artificial intelligence (AI) and cloud-based services, which require high performance and high power density processors, such as control processing units (CPUs) and graphic processing units (GPUs).

Thermal management for a data center that includes several active electronics racks is critical to ensure proper performance of servers and other information technology (IT) equipment (e.g., performing IT data processing services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is to liquid cool the IT equipment. For instance, equipment may include cold plates on which processors are mounted within the equipment. Cooling liquid is passed through the cold plates in order to transfer heat away from the active processors.

With fluid flowing through liquid cooling equipment, such as tubes, fittings, etc., within the rack, leaks may occur (e.g., due to wear and tear, defective parts, mal-operation, etc.). As a result, fluid may leak onto the electronics (e.g., servers) that are mounted in the rack, and may cause damage (e.g., electrical shorts). Thus, there is a need for a leak segregation and detection system that prevents leaking fluid (e.g., from fittings) from spreading throughout an electronics rack and coming into contact with electronics mounted therein, as well as detects the leaking fluid in order manage (e.g., deactivate) electronics that may be affected by the leaking fluid.

BRIEF DESCRIPTION OF THE DRAWINGS

The embodiments are illustrated by way of example and not by way of limitation in the figures of the accompanying drawings in which like references indicate similar elements. It should be noted that references to "an" or "one" embodiment of this disclosure are not necessarily to the same embodiment, and they mean at least one. Also, in the interest of conciseness and reducing the total number of figures, a given figure may be used to illustrate the features of more than one embodiment, and not all elements in the figure may be required for a given embodiment.

DETAILED DESCRIPTION

Figure 1:
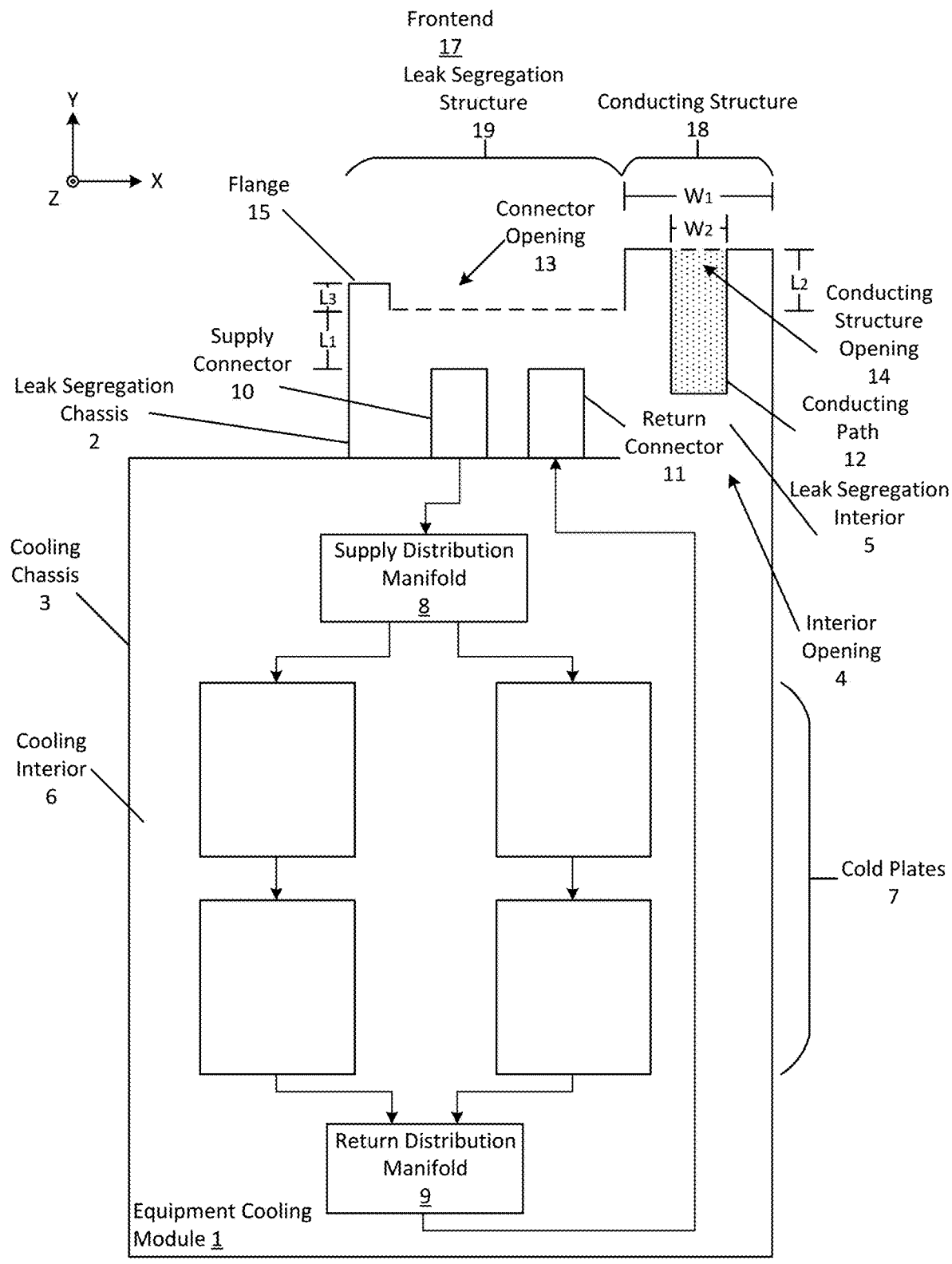
FIG. 1 shows an example of an equipment cooling module according to one embodiment.

Several embodiments of the disclosure with reference to the appended drawings are now explained. Whenever the shapes, relative positions and other embodiments of the parts described in a given embodiment are not explicitly defined, the scope of the disclosure here is not limited only to the parts shown, which are meant merely for the purpose of illustration. Also, while numerous details are set forth, it is understood that some embodiments may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

The present disclosure solves the problem of segregating leaks (e.g., leaking liquid) that may occur from liquid cooling components (e.g., cold plates, connectors, liquid carrying lines, fittings, etc.) in an electronics rack from coming into contact with other electronics (e.g., servers) mounted therein, and in addition detecting the leaking liquid in order to mitigate any issues that may occur due to the leaking liquid (e.g., shutting down or powering down electronics that may be affected by the leak). Specifically, the present disclosure describes a liquid segregation and detection system for an electronics rack (e.g., server rack) that provides a reliable server and rack solution for minimizing the effects of leaks within an electronics rack that are liquid cooled. For instance, the system may include an equipment cooling module (or component) and a rack cooling module that are designed to provide liquid cooling to pieces of information technology (IT) equipment (e.g., servers) mounted within the rack, as well as segregating (e.g., containing or preventing) leaks from spreading into electronics within the rack.

In particular, the equipment cooling module may include liquid cooling components (e.g., cold plates, lines or tubes, distribution manifolds, etc.) within a (e.g., equipment) cooling chassis. The module may also include a leak segregation chassis that is coupled to the cooling chassis that has connectors that are coupled to the liquid cooling components. Specifically, the leak segregation chassis may contain (or surround) the connectors, thereby preventing any leaking (or spraying) liquid that may leak from the connectors from spilling out from the equipment cooling module. The leak segregation chassis may also have a first opening that is arranged to receive supply and return manifold connectors (e.g., of the rack cooling module) for coupling to the cooling module's connectors. Extending from an interior of the leak segregation chassis to a second opening may be a conducting path that is arranged to guide liquid from the interior to and out of the second opening. Thus, any leaks that may occur within the cooling module (e.g., at one of the connectors contained therein), may be contained within the module, and in addition, any leaking liquid within the cooling module may be guided by the conducting path out through the second opening. This provides a focal point at which leaking fluid may exit out of the cooling module, rather than liquid spilling out along different directions and locations.

In one embodiment, the rack cooling module may be a part of (or removably coupled to) the electronics rack (e.g., mounted to and disposed within an inside of the electronics rack), and include a manifold section that includes main supply and return connectors that are arranged to couple to a coolant source and one or more pairs supply and return manifold connectors that are coupled to the main connectors (e.g., via distribution manifolds). The rack cooling module may also include a detection section that is adjacent to the manifold section and includes a leak detection cable within a (e.g., vertical) channel contained therein, and a main leak segregation structure that is positioned between the main supply and return connectors and the pairs of manifold connectors, and at least partially contains the main connectors. Specifically, the main leak segregation structure prevents liquid that may leak from the manifold connectors spilling onto electronics mounted below the structure, as well as being designed to guide liquid (e.g., along a liquid path) to an opening of the detection section. As a result, if a leak were to occur at the main connectors, the leak detection cable (or rather a sensor coupled to the cable) would produce signal that indicates that there is a leak in response to the cable coming into contact with liquid being guided by the segregation structure into the channel.

In addition, the detection section may provide leak detection for equipment cooling modules that are coupled to the rack cooling module. Specifically, when a cooling module is coupled to the rack module, a pair of manifold connectors of the manifold are received within the first opening of the cooling module and are coupled to respective connectors of the cooling module. In addition, a conducting structure that includes the conducting path of the cooling module is received by the detection section, such that the conducting path opens into an opening of the leak detection channel. This may allow liquid to flow from the equipment cooling module, through the conducting path, and into the leak detection channel. As a result, the rack cooling module may detect a liquid leak that occurs within the cooling module. Thus, the leak segregation and detection system described herein provides a complete segregation of the fluid (e.g., liquid cooling) system from electronics mounted within the electronics rack, and provides an efficient and fast leak detection design.

According to one embodiment, an equipment cooling module that includes a leak segregation chassis that includes a supply connector, a return connector, and a conducting path that are contained within an interior of the leak segregation chassis, a first opening that is arranged to receive a supply manifold connector and a return manifold connector for coupling to the supply connector and the return connector, respectively, and a second opening that is adjacent to the first opening, wherein the conducting path extends from the interior of the leak segregation chassis to the second opening and is arranged to guide liquid from the interior of the leak segregation chassis to and out of the second opening; a cooling chassis that is coupled to the leak segregation chassis, and includes a cold plate that is contained within an interior of the cooling chassis, wherein the cold plate is arranged to couple with an information technology (IT) component of an electronics board (or a piece of IT equipment), and is coupled to the supply connector and to the return connector; and an interior opening that couples the interior of the cooling chassis to the interior of the leak segregation chassis such that liquid may flow from the cooling chassis into the leak segregation chassis.

In one embodiment, the conducting path tapers from a surface of the interior of the leak segregation chassis towards the second opening. In some embodiments, the leak segregation chassis and the cooling chassis are one integrated unit. In some embodiments, the first and second openings are the only openings into the equipment cooling module. In one embodiment, the cold plate is one of a plurality of cold plates, wherein the cooling chassis further includes a supply distribution manifold, a return distribution manifold, and the plurality of cold plates contained therein, wherein the supply distribution manifold couples the plurality of cold plates to the supply connector to supply liquid coolant from a coolant source, and the return distribution manifold couples the plurality of cold plates to the return connector to return warmed liquid coolant from the plurality of cold plates to the coolant source.

In one embodiment, the leak segregation chassis comprises a conducting structure that includes the conducting path and the second opening, and is on a first side of the first opening; and a flange that is on a second side of the first opening that is opposite to the first side, wherein the first opening is recessed between the flange and the conducting structure. In another embodiment, the conducting structure has a first length that extends beyond the first opening and the flange has a second length that extends beyond the first opening, wherein the first length is greater than the second length.

A rack cooling module for an electronics rack, the rack cooling module comprising: a manifold section that includes a main supply connector and a main return connector that are arranged to couple to a coolant source, and a pair of supply and return connectors that are positioned below the main supply and return connectors, the supply connector is coupled to the main supply connector for receiving liquid coolant from the coolant source and the return connector is coupled to the main return connector for returning liquid coolant to the coolant source, wherein the pair is arranged to couple to a cold plate that is arranged to draw heat away from an information technology (IT) component; a detection section that is adjacent to the manifold section and includes a channel that extends vertically within the detection section, the channel comprising a leak detection cable, an opening into the channel; and a main leak segregation structure that is positioned between the main supply and return connectors and the pair of supply and return connectors and at least partially contains the main supply and return connectors, the main leak segregation structure having a liquid path to the opening of the detection section and is arranged to allow liquid to flow into the channel via the opening.

In one embodiment, the manifold section comprises a plurality of pairs of supply and return connectors, which includes the pair of supply and return connectors, and are positioned below the main leak segregation structure and are arranged in a stack, wherein the detection section comprises a plurality of openings into the channel, each opening associated with and adjacent to a corresponding pair of the plurality of pairs. In one embodiment, the leak detection cable is arranged in the channel to detect a presence of liquid that flows into the channel from the opening, wherein the detection section comprises a plurality of leak detection cables, each cable associated with a respective opening of the plurality of openings and is arranged to detect the presence of liquid that flows into the channel from the respective opening. In some embodiments, each opening is positioned below its respective pair of supply and return connectors along a vertical axis.

In one embodiment, the plurality of openings is a first plurality of openings and the channel comprises a second plurality of openings, wherein the rack cooling module further comprises a plurality of receiving channels, each receiving channel coupling one opening of the first plurality of openings to one opening of the second plurality of openings. In some embodiments, each of the plurality of first openings has a first width along a horizontal axis and each of the plurality of second openings has a second width along the horizontal axis that is narrower than the first width. In another embodiment, the main leak segregation structure comprises at least three elevated sides that surround the main supply and return connectors and the opening of the detection section.

According to another embodiment, a leak segregation and detection system for an electronics rack, the system comprising: a rack cooling module that includes: a fluid manifold section that has a main supply connector and a main return connector, and a pair of supply and return manifold connectors that are positioned below the main supply and return connectors to which the supply and return manifold connectors are coupled, respectively, and a detection section that includes a channel that extends vertically that has a leak detection cable contained therein, a main leak segregation structure that is positioned between the main supply and return connectors and the pair of supply and return manifold connectors, and at least partially contains the main supply and return connectors, the main leak segregation structure having a liquid path to the channel and is arranged to guide liquid into the channel; and an equipment cooling module that includes: a leak segregation chassis that has a pair of supply and return connectors and a conducting path that are contained within an interior of the leak segregation chassis, a first opening, and a second opening that is adjacent to the first opening, wherein the conducting path extends from the interior of the leak segregation chassis to the second opening, a cooling chassis that includes a cold plate that is arranged to couple with an information technology (IT) component of an electronics board, and is coupled to the supply and return connectors, and an interior opening that fluidly couples an interior of the cooling chassis to the interior of the leak segregation chassis, wherein the equipment cooling module is arranged to couple to the rack cooling module such that the pair of supply and return manifold connectors are received through the first opening and couple to the pair of supply and return connectors.

In one embodiment, the leak segregation chassis comprises: a conducting structure that includes the conducting path and the second opening, and is on a first side of the first opening; and a flange that is on a second side of the first opening that is opposite to the first side, wherein the first opening is recessed between the flange and the conducting structure. In some embodiments, the detection section comprises a receiving channel that opens into the channel, wherein equipment cooling module is arranged to couple to the rack cooling module such that the first opening receives the pair of supply and return manifold connectors and the receiving channel receives the conducting structure, wherein upon the receiving channel receiving the conducting structure the second opening opens into the channel of the detection section. In another embodiment, the conducting structure has a first length that extends beyond the first opening and the flange has a second length that extends beyond the first opening, wherein the first length is greater than the second length.

In one embodiment, the fluid manifold comprises a plurality of pairs of supply and return manifold connectors that are positioned below the main leak segregation structure and are arranged in a stack, wherein the detection section comprises a plurality of openings into the channel that are positioned below the main leak segregation structure, each opening associated with and adjacent to a corresponding pair of the plurality of pairs, wherein each pair of supply and return manifold connectors and associated openings is arranged to couple to a different equipment cooling module. In another embodiment, the main leak segregation structure comprises at least three elevated sides that surround the main supply and return connectors and a third opening into the channel of the detection section.

In one embodiment, as used herein, "to couple" one component (or element) to another component may refer to "fluidly" coupling the two components so that a fluid (or liquid), such as a cooling liquid or a liquid coolant may flow between the two components. For example, coupling a first tube to a second tube may couple both tubes together such that liquid coolant may flow from the first tube into the second tube (and/or vice a versa).

FIG. 1 shows an example of an equipment cooling module (or device) 1 (which hereafter may be referred to as "cooling module") according to one embodiment. Specifically, this figure is showing a top-down (e.g., internal) view of the cooling module 1 that is arranged to provide liquid cooling to one or more electronics boards (e.g., servers), and is arranged (or designed) to segregate (or prevent) any liquid within the module (e.g., which may leak from one or more liquid cooling components contained therein) from leaking (or spilling) out of the module, thereby preventing leaking liquid from coming into contact with other components (e.g., servers) within an electronics rack (e.g., when the cooling module is mounted within the rack). More about how the cooling module segregates leaking liquid from a remainder of the electronics rack is described herein.

As shown, the cooling module includes a cooling chassis 3 that is positioned towards (or at) a backend 16 of the cooling module and includes a leak segregation chassis 2 that extends from the cooling chassis towards a frontend 17 of the module. In one embodiment, both chassis are one integrated unit. For instance, both chassis may be composed of one or more pieces of material (e.g., a metal, plastic, etc.) that is formed into one integrated chassis (e.g., and are therefore fixedly coupled to one another). Thus, the cooling module may be a sealed enclosure. As described herein, this enclosure may include one or more openings that are positioned at the frontend 17 of the module. In another embodiment, the chassis may be removably coupled to one another (e.g., via one or more fasteners, etc.).

As described herein, the cooling chassis 3 includes liquid cooling components that are arranged to cool one or more electronics boards (or more specifically IT components that are mounted on the board), and the leak segregation chassis 2 is arranged to prevent liquid from leaking out of the cooling module. In another embodiment, the leak segregation chassis is also arranged to provide one or more openings through which the cooling module may be coupled to one or more (e.g., manifold) connectors in order to create one or more heat exchanging loops and one or more openings through which liquid may be guided out of the cooling module. More about the components of the leak segregation chassis is described herein.

In addition, the cooling module also includes an interior opening 4 that (e.g., fluidly) couples an interior (or cooling interior) 6 of the cooling chassis (e.g., a hollow space that is within or is surrounded by the cooling chassis) to an interior (or leak segregation interior) 5 of the leak segregation chassis such that liquid may flow from the (e.g., interior 6 of the) cooling chassis into the (e.g., interior 5 of the) leak segregation chassis (and/or vice a versa). More about the chassis and the interior opening will be described herein.

The leak segregation chassis 2 includes (or is composed of) a leak segregation structure 19 and a conducting structure 18. As shown, both structures are fluidly coupled to one another, such that the leak segregation interior 5 includes an interior of the leak segregation structure and an interior of the conducting structure.

Figure 4:
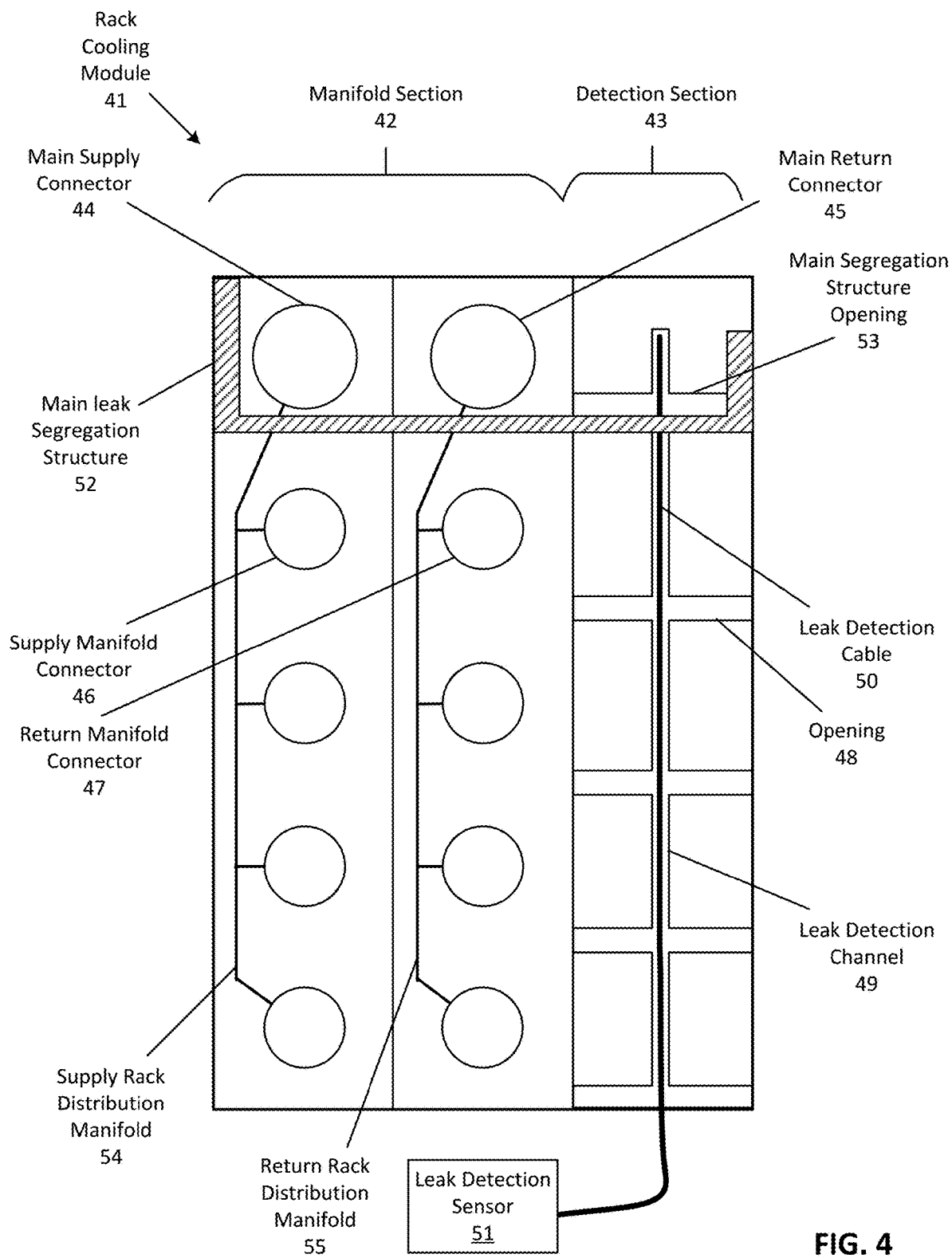
FIG. 4 shows an example of a rack cooling module according to one embodiment.

The leak segregation structure 19 includes a (e.g., pair of) connectors that include a) supply connector 10 and a return connector 11 contained therein. This structure also includes a connector (or first) opening 13 that is arranged (or sized) to receive a supply manifold connector and a return manifold connector (e.g., supply and return manifold connectors 46 and 47, as shown in FIG. 4) for (removably) coupling to the supply and return connectors, respectively. In some embodiments, the connector opening 13 may be arranged to receive manifold connectors, while also being arranged to prevent liquid from leaking out from the interior of the leak segregation chassis. For example, the leak segregation structure 19 may have an elevated edge (e.g., such as edge 20 shown in FIG. 2), which prevents liquid from leaking out of the opening.

As shown, the connector opening 13 is positioned (or located) in front (e.g., a front side) of the supply and return connectors. Specifically, the connector opening and the supply and return connectors may be separated by a length, $L_1$, such that the connector opening is positioned in front of (in the Y-direction) the connectors. As a result, both connectors may be completely surrounded by the leak segregation structure (e.g., along at least the Y-direction). In one embodiment, $L_1$ may be equal to or less than a length of the supply and return manifold connectors (e.g., manifold connectors 46 and 47, as shown in FIG. 4) to which the supply and return connectors are configured to couple. In which case, the leak segregation structure may (e.g., at least partially) contain the supply and return manifold connectors and the supply and return connectors when both pairs of connectors are coupled to each other. More about coupling the cooling module to manifold connectors is described herein.

In addition, the connector opening 13 is recessed between the conducting structure 18 and a flange (or extended arm) 15 that are positioned on opposite sides of the opening. Specifically, the conducting structure is on a right (or first) side of the opening 13 and the flange is positioned on a left (or second) side of the opening. As described herein, this configuration may promote the equipment cooling module's removable coupling to the rack cooling module. In one aspect, the flange and conducting structure may extend beyond the connector opening 13 towards the frontend 17 (e.g., in the Y-direction), having different lengths. For instance, the conducting structure 18 may extend beyond the opening 13 at one length, $L_2$, whereas the flange may extend beyond the opening at another length, $L_3$, where $L_2$ is greater than $L_3$. In another embodiment, the $L_2$ and $L_3$ may be the same, or $L_3$ may be greater than $L_2$.

In one embodiment, the flange may be arranged to provide a more robust design to contain or capture leaked liquid within the equipment cooling module. For instance, the flange may extend from the cooling chassis and out past the connector opening 13 (in the Y-direction), where the flange prevents liquid from escaping a side of the leak segregation chassis. In another embodiment, the flange may be arranged to secure the equipment cooling module to the rack cooling module. More about securing the modules together is described herein.

The conducting structure 18 includes a conducting (or second) opening 14 that is adjacent to the connector opening 13, where both openings open towards the frontend 17 of the equipment cooling module. In one embodiment, the openings may open towards different directions. Specifically, the connector opening opens towards the frontend (e.g., in the Y-direction), while the conducting opening may open towards a side (e.g., in the X-direction) of the equipment cooling module. In one embodiment, the connector opening and the conducting opening are the only openings into the equipment cooling module 1 (e.g., in order to limit a number of locations at which liquid may leak out).

The conducting structure 18 also includes a conducting path 12 that extends from the interior 5 of the leak segregation chassis to the conducting opening 14 and is arranged to guide liquid from the interior of the leak segregation chassis to and out of the conducting opening. In one embodiment, the path may extend from the interior 6 of the cooling chassis. In which case, the path may extend through the interior opening 4. In some embodiments, the conducting path may have a geometry or shape (e.g., a length, a width, a slope (or taper), etc.) that promotes liquid to (e.g., naturally) move along the conducting path towards the conducting opening. For instance, the geometry of the path may use gravity to move the liquid from one location along the conducting path to the opening. More about the geometry of the conducting path is described herein. As shown, the conducting structure has a width, $W_1$, while the conducting structure opening 14 has another width, $W_2$, which is smaller than $W_1$. More about these widths are described herein.

As described herein, the cooling chassis 3 may include one or more pieces of liquid cooling components. As shown, the cooling chassis includes a supply distribution manifold 8, four cold plates 7, and a return distribution manifold 9. In one embodiment, the cooling chassis may include more or less components, such as having more or less cold plates. The supply distribution manifold 8 couples the supply connector 10 to (e.g., one or more of) the cold plates 7, while the return distribution manifold 9 couples (one or more of) the cold plates 7 to the return connector 11. In one embodiment, the components may be coupled together via lines (or tubes) that supply and/or return liquid (coolant) from one component to another. In which case, the components may include one or more inlets and/or one or more outlets, each of which may include a connector, where the connectors of different components may be coupled (or connected) together via one or more lines (e.g., flexible tubes). Thus, when the supply and return connectors are coupled to a coolant source (e.g., via supply and return manifold connectors), the distribution manifolds 8 and 9 create one or more heat transfer loops. Specifically, once coupled to the coolant source, the supply distribution manifold receives liquid coolant from the supply connector and supplies the coolant to the cold plates, which when coupled to (e.g., in contact with) one or more IT components of one or more electronics boards (or pieces of IT equipment) are designed to draw heat away from the components and into the coolant flowing therein, thereby warming the coolant. The cold plates provide the warmed coolant to the return distribution manifold 9, which returns the warmed coolant to the coolant source, via the return connector 11.

As shown, the cooling chassis includes two pairs of series-connected cold plates that are coupled to the distribution manifolds 8 and 9 in parallel. In another embodiment, the cold plates may be coupled in series and/or in parallel in any configuration. As described herein, the cold plates may be contained within the cooling interior 6. In which case, when the cold plates are coupled to IT components, the cooling chassis 3 may be coupled between the cold plates and IT components such that the cooling chassis separate a cold plate from a respective IT component from which the cold plate draws heat. Thus, thermal energy may pass from the IT components, through the cooling chassis, and into respective cold plates. In which case, the cooling chassis may be composed of any thermally conductive material (e.g., a material having a thermal conductivity that is greater than a predetermined threshold) in order to promote the thermal heat transfer into the cold plates.

In another embodiment, at least a portion of the cold plates may extend out of the cooling chassis. For example, the cooling chassis may include one or more openings (not shown) that may be positioned along a bottom (side or top) of the cooling chassis. In which case, one or more cold plates may be mounted into an opening, through which at least one side of the mounted cold plate may be exposed out from the cooling chassis and into the environment, whereas a remainder of the cold plate may be enclosed within the cooling interior 6. As a result, when the equipment cooling module is mounted on an electronics board, one or more cold plates may come into (e.g., direct) contact with one or more IT components that are mounted on the board. As a result, the cold plate may couple to an IT component, without (e.g., at least a portion of) the cooling chassis being coupled between the plate and the component.

As described herein, the leak segregation chassis 2 includes the supply connector 10 and the return connector 11. For example, the connectors may be fixedly coupled to (e.g., at least one internal side of) the leak segregation chassis. In one embodiment, the connectors may be held (or mounted) in place within the chassis through one or more connector holders (e.g., that are fixed to the segregation chassis and/or fixed to at least a portion of the cooling chassis). In another embodiment, the connectors may be housed within the leak segregation chassis using any mechanical structure.

Figure 2:
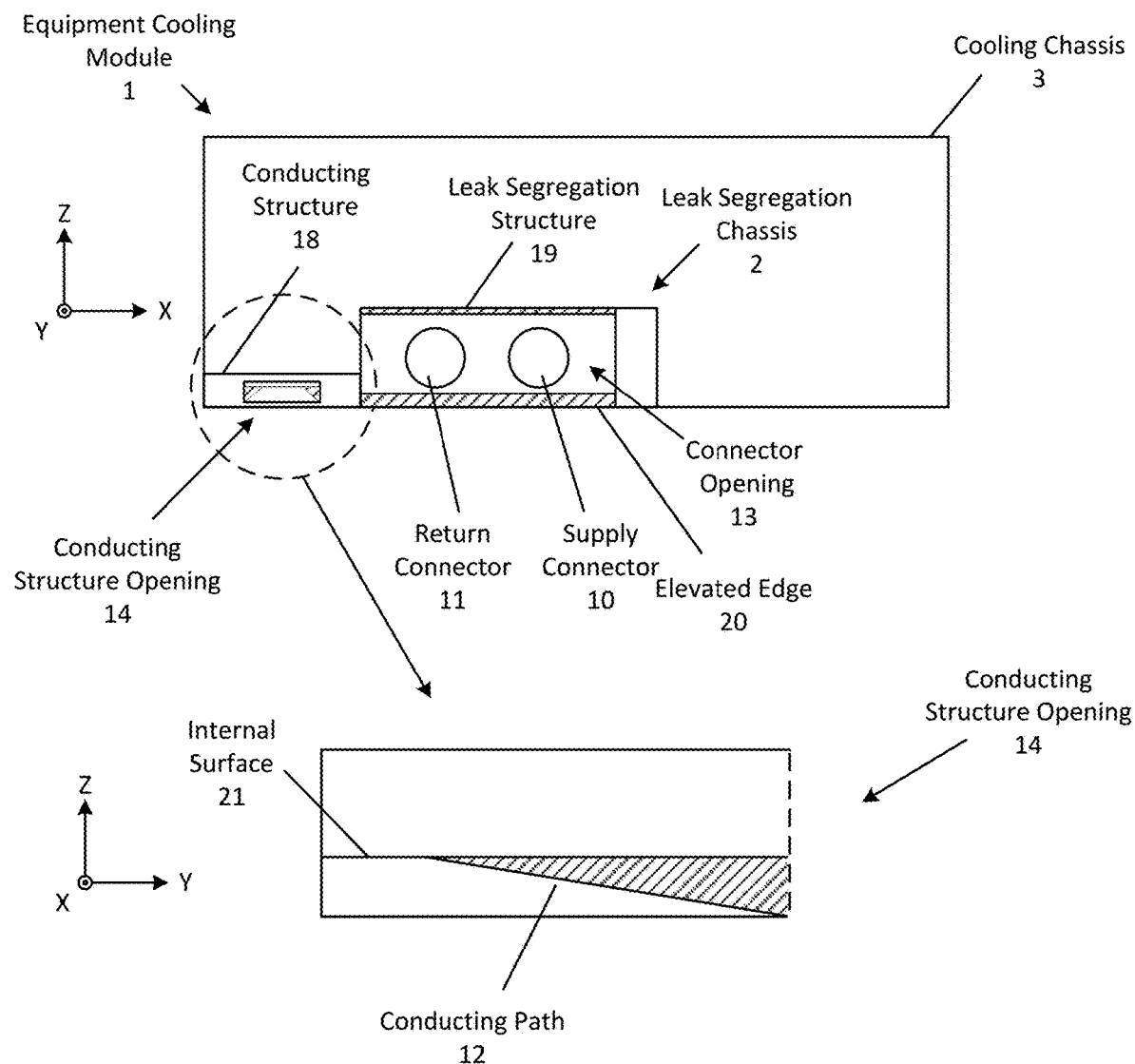
FIG. 2 shows several views of the equipment cooling module according to one embodiment.

FIG. 2 shows several views of the equipment cooling module 1 according to one embodiment. For instance, this figure is showing a front view (of the frontend 17) of the equipment cooling module 1, where the leak segregation chassis 2 is positioned in the front bottom left corner of the cooling chassis. In another example, the segregation chassis may be positioned elsewhere, such as being in the middle of (or centered with) the cooling chassis. In addition, this figure shows through the openings of the conducting structure 18 and the leak segregation structure 19. Specifically, this figure is showing into the connector opening 13 of the segregation structure that shows (e.g., a front side of) the supply connector 10 and the return connector 11. In addition, this figure also shows an elevated edge 20 (e.g., having a height in the Z-direction) at the connector opening 13, which is arranged to prevent liquid (e.g., up to its height) from spilling out of the connector opening 13. In another embodiment, the leak segregation chassis may not include an elevated edge.

As shown, the connector opening 13 and the conducting structure opening 14 have rectangular shapes. In another embodiment, either of the openings may be shaped differently. For example, as described herein, the connector opening may be arranged for receiving manifold connectors for coupling to the supply and return connectors of the cooling module. In one embodiment, the connector opening may have a same (e.g., cross-sectional) shape as the manifold connectors, but may be slightly larger in order to receive the manifold connectors. For example, when the manifold connectors are cylinders having a first diameter, the connector opening may include two circular openings that each have a second diameter that is (e.g., slightly) larger than the first diameter (e.g., by a threshold amount), thereby allowing the manifold connectors room to be received, while minimizing space between the manifold connectors and edges of the connector opening.

This figure illustrates a side (e.g., cross-sectional) view the conducting structure 18. Specifically, this shows an internal surface 21 of the (e.g., leak segregation interior and/or the cooling interior 6 of the) equipment cooling manifold 1. In addition, this shows that the conducting path 12 has a slope or tapers (e.g., in the Z-direction) from the internal surface 21 towards the conducting structure opening 14. The tapering of the conducting path may enable liquid to flow downward from the surface 21 towards and out of the opening 14. In one embodiment, the internal surface 21 may be level (or flat) throughout the inside of the equipment cooling module. In another embodiment, at least a portion of the internal surface of the equipment cooling module 1 may be slopped or tapered towards the conducting path in order for liquid to be guided from the cooling interior 6 and/or the leak segregation interior 5 towards the path.

Figure 3:
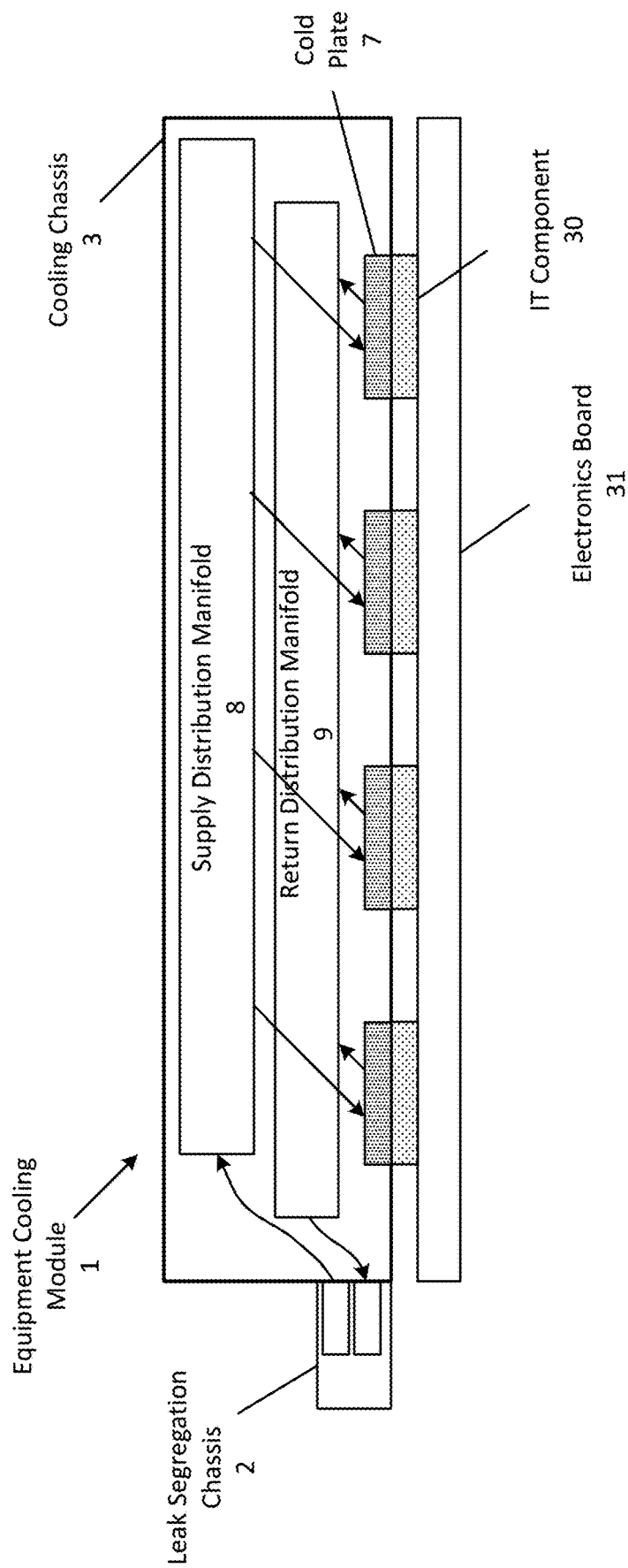
FIG. 3 shows the equipment cooling module mounted on an electronics board according to one embodiment.
Figure 9:
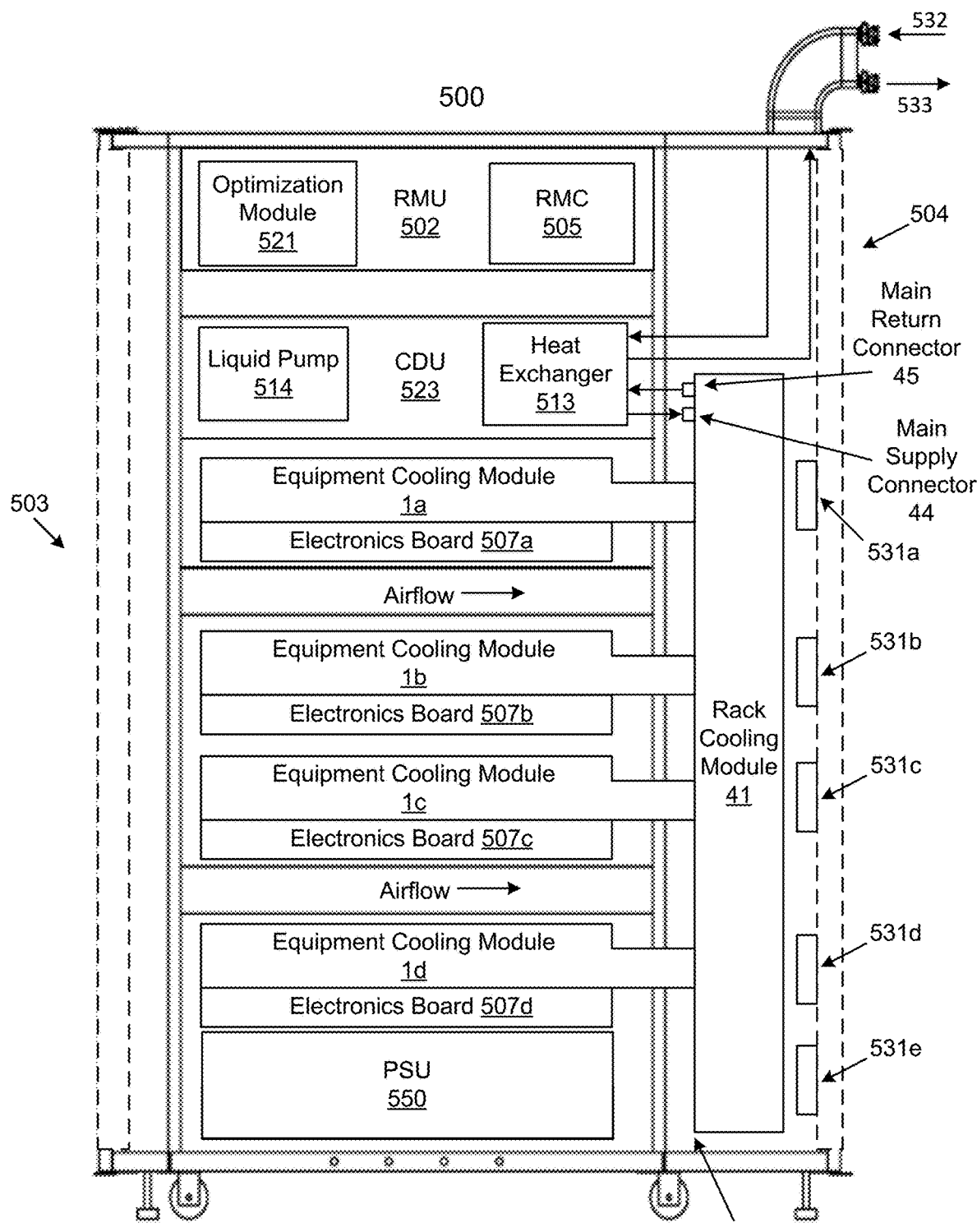
FIG. 9 is an example of an electronics rack that includes a leak segregation and detection system according to one embodiment.

FIG. 3 shows a side (e.g., internal) view of the equipment cooling module 1 mounted on an electronics board 31 according to one embodiment. In one embodiment, the board may be any element or piece of equipment that is arranged to hold one or more IT components and/or any type of electronic component. For example, the electronics board may be a server printed circuit board (PCB) that is arranged (or designed) to hold one or more IT components. In some embodiments, the board (e.g., a blade server) may be a mounted within an electronics rack, as shown in FIG. 9.

As shown, the electronics board 31 includes four IT components 30 (e.g., which are mounted in a row). In some embodiments, the board 31 may include one or more IT components 30 (e.g., central processing units or CPUs, graphical processing units (GPUs), memory, and/or storage devices). The IT component may perform data processing tasks, where the IT component may include software installed in a storage device, loaded into the memory, and executed by one or more processors to perform the data processing tasks. In one embodiment, the electronics board may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers (e.g., the IT component 30) perform the actual tasks, which may generate heat during the operations. This heat, as described herein needs to be transferred away from the component in order to ensure that it does not overheat, which may result in failure.

The figure also shows the liquid cooling components contained within the cooling chassis 3 being coupled in a different configuration than that shown in FIG. 1. For instance, unlike the configuration shown in FIG. 1 in which two pairs of two series-connected cold plates that are coupled in parallel with the manifolds, this figure shows that the four cold plates are all coupled in parallel with both manifolds. Thus, as the equipment cooling module 1 is mounted on the electronics board 31 (as shown), and therefore, each cold plate is coupled (or mounted) on a respective IT component 30, as shown, each cold plate may be associated with its own heat exchanging loop in which it draws heat (e.g., via a portion of the cooling chassis) away from its respective IT component. In another embodiment, the components contained therein may have a same (or similar) configuration than that illustrated in FIG. 1 (e.g., two pairs of two series-connected cold plates being coupled to both manifolds).

FIG. 4 shows (e.g., a front view of) a rack cooling module 1 according to one embodiment. Specifically, the rack cooling module includes a manifold section 42, a detection section 43, a main leak segregation structure 52, and a leak detection sensor 51. As shown, the detection section is adjacent to (or next to) the manifold section. In one embodiment, both sections may be one integrated unit (e.g., both sections being composed of one housing or frame). In another embodiment, both sections may be fixedly coupled or removably coupled to one another. In addition, this figure shows that both sections are of a same height. In one embodiment, the rack cooling module is arranged to be housed (or contained) within (e.g., a housing of) the electronics rack. In one embodiment, the sections may be sized to fit within an electronics rack (e.g., having a height that is equal to or less than a height of 42U). In another embodiment, the sections may be sized differently (e.g., the sections having different heights). In some embodiments, the rack cooling module may be removably coupled (or mounted) inside the electronics rack.

The manifold section includes a main supply connector 44 and a main return connector 45, which are arranged to couple to a coolant source (e.g., which may be a part of an electronics rack or a separate coolant source). The manifold section 42 also includes four pairs of manifold connectors, each pair having a supply manifold connector 46 and a return manifold connector 47. Specifically, the pairs of manifold connectors are positioned below the main supply and return connectors and are arranged in a stack (e.g., the pairs being stacked in a vertical column). Although illustrated has having four pairs of connectors, the manifold section may include more or less pairs of connectors, such as having one pair of connectors. As described herein, each pair of manifold connectors may be arranged to (e.g., removably) couple to the (e.g., respective) pair of connectors of the equipment cooling module.

In one embodiment, each supply manifold connector 46 is coupled to the main supply connector 44 for receiving liquid coolant from the coolant source and each return manifold connector 47 is coupled to the main return connector 45 for returning (e.g., warmed) liquid coolant to the coolant source. Specifically, each of the supply manifold connectors is coupled to the main supply connector via a supply rack distribution manifold 54 that is arranged to supply the liquid coolant received from the main supply connector to each (or at least some of) the supply manifold connectors. Similarly, each of the return manifold connectors is coupled to the main return connector via a return rack distribution manifold 55 that is arranged to return the warmed liquid coolant from each (or at least one of) the return manifold connectors to the main return connector. In one embodiment, both manifolds are positioned inside the fluid manifold.

In one embodiment, the manifold connectors may be the same type and/or size of (e.g., liquid) connectors. In another embodiment, the manifold connectors 46 and 47 may be different than the main supply and return connectors 44 and 45. For example, the main connectors may be of a different type and/or size than the manifold connectors. In this case, the main connectors have a larger diameter than a diameter of the manifold connectors (e.g., which may allow the main connectors to provide a sufficient flow of liquid to and from the manifold connectors).

The detection section 43 includes a main segregation structure opening 53 and four leak detection openings 48 that open into (or are fluidly coupled to) a leak detection channel 49. As shown, the leak detection channel extends vertically within the detection section. Within (e.g., at least a portion of) the channel is a leak detection cable 50 that is arranged in the channel to detect a presence of liquid that flows into the channel from one or more openings (e.g., openings 48 and/or 53) into the channel. Specifically, the leak detection cable is communicatively coupled to a leak detection sensor 51 (e.g., which may be a part of the rack cooling module 41 and) that is configured to produce a control signal that indicates a presence of liquid, when liquid comes into contact with the leak detection cable. For instance, the detection cable may include at least two wires, and when (e.g., a conductive) liquid comes into contact with the cable, the liquid creates a short between the two wires. Once this occurs, the leak detection sensor detects the short and produces the control signal. In some embodiments, the rack cooling module may use any type of leak detection sensor (and/or cable) to detect a presence of liquid (e.g., within the leak detection channel). In one embodiment the leak detection sensor may transmit the control signal to one or more controllers (e.g., of the electronics rack), which in response may perform one or more leak detection (or mitigation) operations. More about these operations is described herein.

Figure 5:
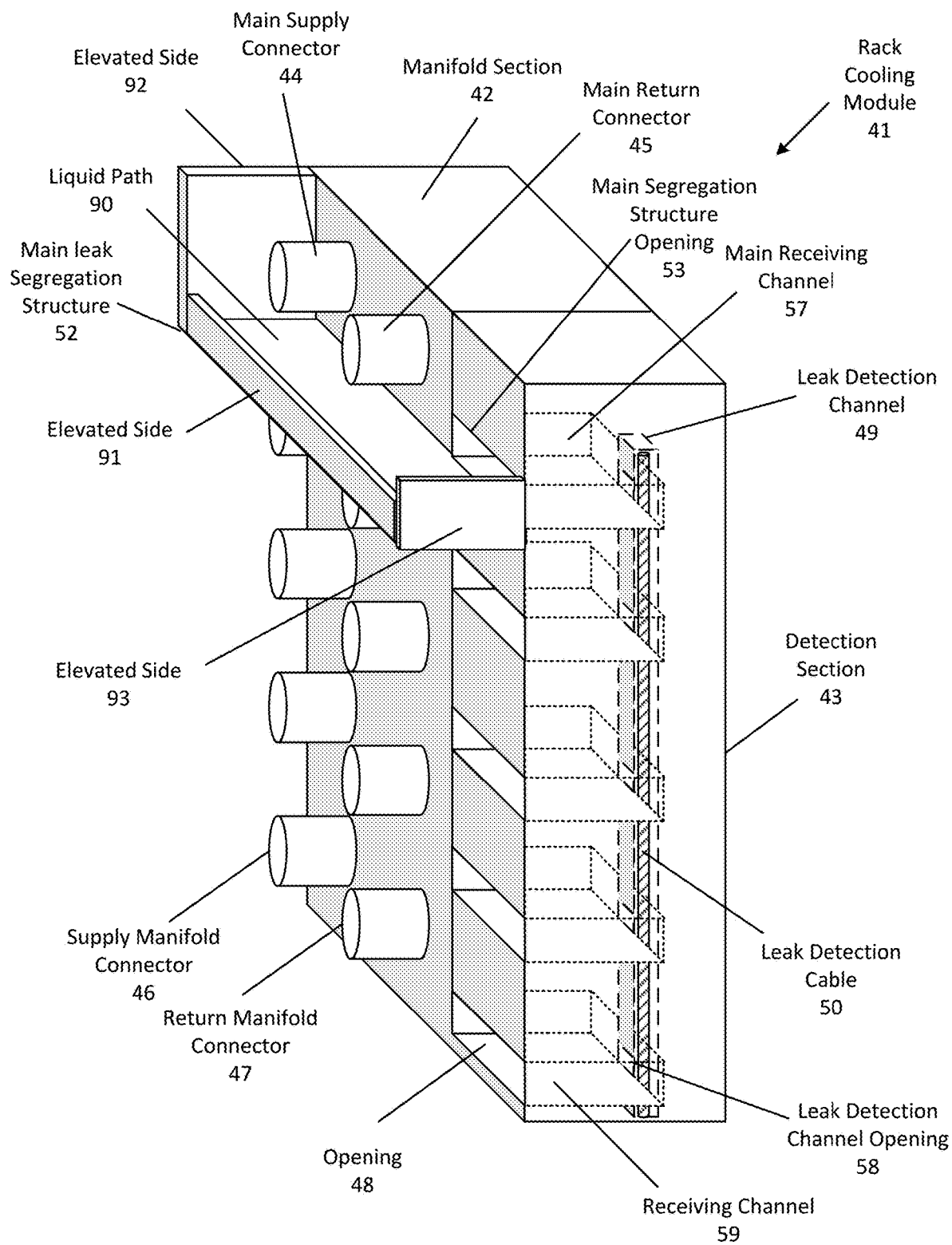
FIG. 5 shows a side perspective view of the rack cooling module according to one embodiment.

In one embodiment, the leak detection channel 49 and the leak detection cable 50 are vertically orientated (with respect to the rack cooling module) in order to promote leak detection. For example, when liquid enters the channel, it travels downward along the leak detection cable. As a result, the traveling liquid may cover a significant amount of surface area of the leak detection cable, which may increase (e.g., above a threshold) a likelihood that liquid is detected when it comes into contact with the cable. In one embodiment, in addition, the leak detection channel may be sized in order to ensure that liquid within the channel comes into contact with the cable. For example, the channel may be sized to fit the cable, while minimizing an amount of open space between the cable and the walls of the channel. In addition, although shown to be rectangular (e.g., as shown in FIG. 5), the leak detection channel may be any shape (e.g., the channel may be shaped similarly to the leak detection cable, both of which having a cylindrical shape).

In one embodiment, each of the openings 48 is associated with and adjacent to a corresponding pair of manifold connectors 46 and 47. Specifically, each opening 48 is positioned below its respective pair of manifold connectors along a vertical axis (e.g., which runs through a top and bottom of the rack cooling module). In one embodiment, the main segregation structure opening 53 may be positioned similarly with respect to the main connectors (e.g., being below the main connectors). In some embodiments, the openings may be below through respective connectors such that at least a bottom of the openings is below a bottommost point of the respective connectors. Being below the connectors ensures that water will flow downward towards and into their respective opening, as described herein.

As shown, the detection section 43 includes an opening 48 for each pair of supply manifold connectors. In one embodiment, the detection section may include more or less openings 48. For example, the detection section may include an additional number of openings, one for a corresponding pair of manifold connectors. In another embodiment, the detection section may include more (or less) openings 48 than a number of pairs of manifold connectors that are contained within the manifold section 42.

In one embodiment, each arrangement of manifold connectors and their respective opening 48 allows at least one equipment cooling module 1 to couple to the rack cooling module. In particular, when coupling an equipment cooling module to the rack cooling module, a pair of manifold connectors 46 and 47 may couple with the supply and return connectors 10 and 11, respectively, (e.g., by being received through the conductor opening 13, as described herein), while at least a portion of the conducting structure 18 is received by (or through) a respective opening 48. As a result, when an equipment cooling module is coupled to the rack cooling module, the rack cooling module may circulate liquid coolant through the cooling module (e.g., via the manifold connectors), as well as fluidly coupling the conducting path 12 of the conducting structure 18 with the leak detection channel 49. Thus, if a leak occurs within the equipment cooling module 1, liquid coolant may flow through the conducting path 12, out the conducting opening 14 and into the leak detection channel 49. Once within the channel, the liquid may come into contact with the leak detection cable 50, which as a result may detect the presence of the liquid, as described herein. More about coupling the equipment cooling module to the rack cooling module and detecting the presence of liquid is described herein.

As shown, the main leak segregation structure 52 is coupled to a front side (or surface) of the (e.g., manifold section and detection section of the) rack cooling module and is positioned between the main connectors 44 and 45 and the pairs of stacked manifold connectors (or more specifically between the main connectors and a top pair of manifold connectors, as shown). In one embodiment, the segregation structure may be fixedly coupled to the rack cooling module (e.g., via one or more fasteners). In another embodiment, (e.g., at least a portion of) the segregation structure may be removably coupled to the rack cooling module. In one embodiment, the segregation structure may be coupled with the rack cooling module to be water tight, such that liquid may not leak between the segregation structure and the front side of the rack cooling module. In another embodiment, the segregation structure may be a part of the rack cooling module, such that the manifold section, the detection section, and/or the segregation structure are one integrated unit.

In one embodiment, the main leak segregation structure 52 may (at least partially) contain (or surround) at least a portion of the main connectors 44 and 45 in order to prevent (or limit) liquid that leaks from the connectors to spill out and come into contact with other electronics within the rack. For instance, the main leak segregation structure may include elevated edges (or sides) that block at least a portion of the connectors from the ambient environment and prevent liquid from spilling out. More about how the main leak segregation structure contains the main connectors is descried herein.

In addition, the main leak segregation structure extends along (at least a portion of) a width of the (manifold and detections sections of the) rack cooling module. The main leak segregation structure is arranged to guide liquid, which may leak from the main connectors, along the width of the rack cooling module and into the main segregation structure opening 53. As described herein, the main leak segregation structure may have a geometry that promotes the flow of liquid towards the main segregation structure opening 53. As a result, similar to openings 48, when a leak occurs, liquid may flow along (or through) the main leak segregation structure, into the main opening 53, and into the leak detection channel 49 to come into contact with the leak detection cable 50.

FIG. 5 shows a side perspective view of the rack cooling module 41 according to one embodiment. Specifically, this figure shows that the main leak segregation structure 52 includes a liquid path (or liquid holder) 90 and three elevated sides 91-93. In one embodiment, the liquid path may be a bottom side of the main leak segregation structure that is arranged to guide liquid to the main segregation structure opening 53 of the detection section, which is arranged to allow the liquid to flow into the leak detection channel via the opening. In one embodiment, the liquid path may extend from one (a first or right) side of (the manifold section 42 of) the rack cooling module to another (a second or left) side of (the detection section 43 of) the rack cooling module that is opposite to the one side of the manifold section. In some embodiments, the liquid path may be sized to promote the flow of liquid from the one side to the opposite side that has the main opening 53. For example, the liquid path may taper (e.g., downward along a vertical axis) towards the main segregation structure opening 53 in order for liquid to naturally (e.g., through the use of gravity) flow from right to left of the rack cooling module. In another embodiment, the liquid holder 90 may be arranged to hold (or contain) leaking liquid in addition to (or in lieu of) guiding the liquid to the opening 53.

As described herein, the main leak segregation structure 52 includes (at least) three elevated sides that (e.g., at least partially) surround 1) the main supply and return connectors 44 and 45, and/or 2) the main segregation structure opening 53 of the detection section. Specifically, the segregation structure includes a front elevated side 91, an elevated side 92 that is adjacent to (or positioned at) the first side of the (e.g., manifold section of the) rack cooling module, and another elevated side 93 that is adjacent to (or positioned at) the second side of the (e.g., detection section of the) rack cooling module that is opposite to the first side, as previously described.

In one embodiment, each of the sides may have differing heights (e.g., along a vertical axis). For example, the front elevated side 91 may have a height that is (at least) less than a lowest point of the main supply and return connectors along the vertical axis, such that the connectors may couple to connectors of a coolant source without the front side preventing the connectors from coupling together. As shown, the elevated side 92 has a height that extends above the main supply and return connectors (e.g., where the side extends upward along the vertical axis to a top surface of the rack cooling module), whereas the elevated side 93 has a height that is equal to or greater than a height of the main segregation structure opening 53.

In one embodiment, the main leak segregation structure may be sized to (at least partially) contain (at least a portion of) connectors (e.g., coolant source connectors 81, shown in FIG. 7) while coupled to the main supply and return connectors 44 and 45 in order to circulate liquid coolant from a coolant source to the rack cooling module. For instance, the liquid path may extend forward from a front surface of the rack cooling module at a distance that is greater than or equal to a length of the main connectors and the connectors of the coolant source. This is further illustrated in FIG. 7.

In some embodiments, the main leak segregation structure may have a different shape and/or differing dimensions, as describe herein. For example, both the elevated sides 92 and 93 may extend upward from the liquid path 90 to the top surface of the rack cooling module. As another example, the segregation structure 52 may include a top side that is above the main connectors and extends from the front surface of the rack cooling module 41. In another embodiment, the main leak segregation structure may have any shape/dimension that prevents liquid from spilling out and that guides liquid within the structure towards and into the main segregation structure opening 53.

This figure also shows an internal view of the detection section 43, which includes the leak detection channel 49 that has the leak detection cable 50 (which is housed therein), four receiving channels 59, a main receiving channel 57 and five leak detection channel openings 58. In one embodiment, the receiving channels are arranged to couple openings of the detection section 43 with respective leak detection channel openings. For example, the main receiving channel 57 is arranged to couple the main segregation structure opening 53 to a (e.g., top-most) leak detection channel opening in order to allow liquid to flow from the main opening to the channel opening. In addition, the receiving channels (e.g., one) for each opening 48 is arranged to couple its respective opening 48 to a leak detection channel opening 58. In another embodiment, each receiving channel 59 is arranged to receive at least a portion of a conducting structure 18 of an equipment cooling module that is being coupled to the rack cooling module. More about the receiving channel receiving the conducting structure is described herein. In one embodiment, the detection section may include more or less openings and/or channels.

Figure 6:
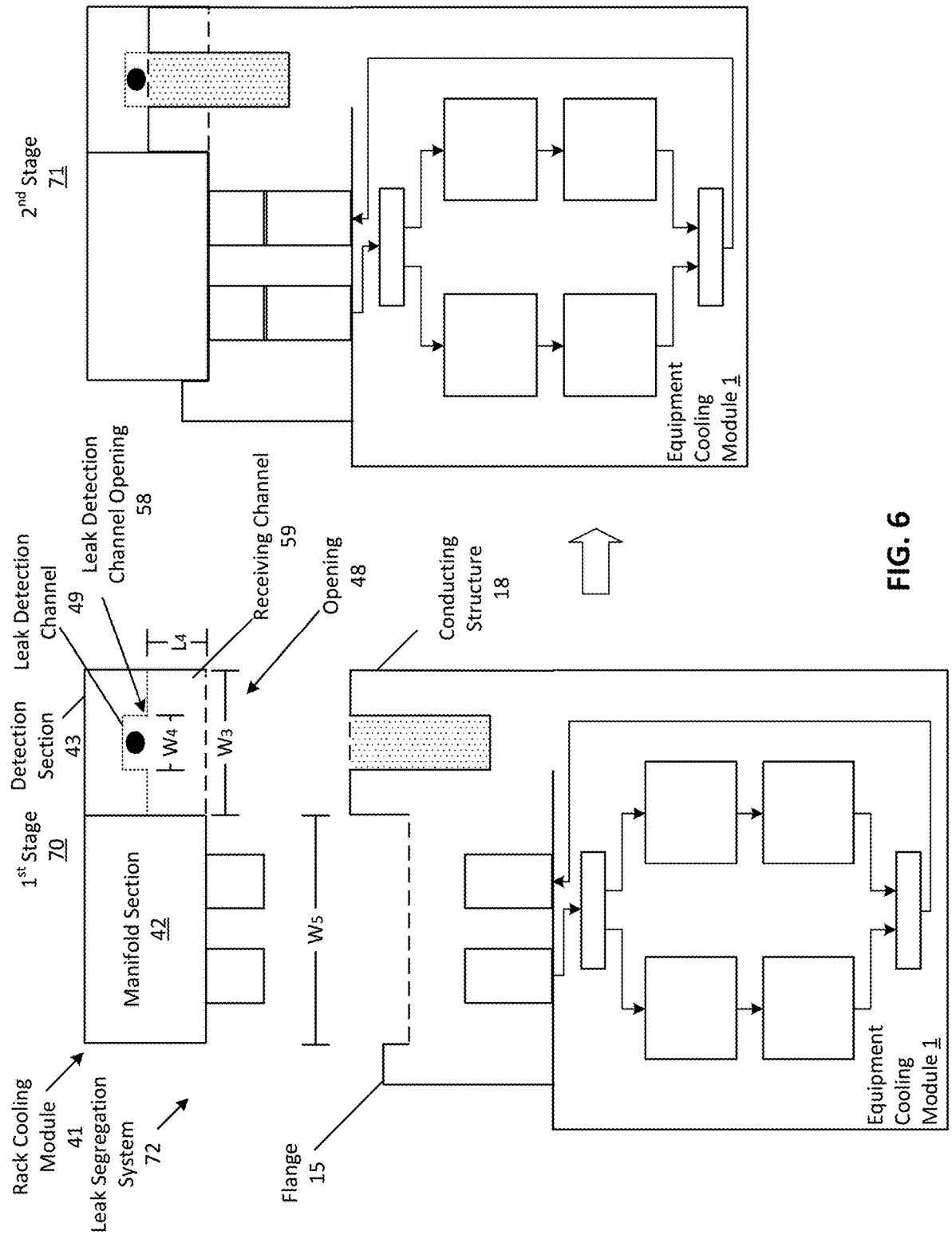
FIG. 6 shows several stages of a leak segregation and detection system in which the equipment cooling module is being coupled to the rack cooling module according to one embodiment.

FIG. 6 shows several stages of a leak segregation and detection system in which an equipment cooling module is being coupled to the rack cooling module according to one embodiment. Specifically, this figure is showing two stages 70 and 71 of a leak segregation and detection system 72 (or leak segregation system), which may be contained inside an electronics rack and that includes the equipment cooling module 1 and the rack cooling module 41, where the equipment module is being coupled to the rack module.

Each stage shows a top-down (e.g., cross-sectional) view of the rack cooling module and the equipment cooling module. Specifically, the cross-sectional view shows the receiving channel 59 of the detection section that opens into, via the leak detection channel opening 58, the leak detection channel 49. In addition, dimensions of the detection section are shown. For instance, the opening 48 has a width (e.g., along a horizontal axis), $W_3$, while the leak detection channel opening 58 has a width, $W_4$, that is smaller (or narrower) than $W_3$. In another embodiment, both widths, $W_3$ and $W_4$ may be the same. In addition, the receiving channel 59 has a length, $L_4$, that extends from the opening 48 to the leak detection channel opening 58. In one embodiment, each of the openings 48 and 58, and channels 59 of the detection section may have these dimensions. For example, referring to FIG. 5, each of the four openings 48 may have a width of $W_3$, each of the four openings 58 may have a width of $W_4$, and each of the four receiving channels 59 may have a length of $L_4$. In some embodiments, the main opening 53 and the main channel 57 may have similar (or the same) dimensions as opening 48 and channel 59, respectively. In another embodiment, at least some of the dimensions of the openings and/or channels may be different. For example, at least some of openings 48 may have the width of $W_3$, while others may have a different width. This figure also shows dimensions of the manifold section 42. For instance, the manifold section has a width (e.g., from one side that is adjacent or abutting the detection section to an opposite side) of $W_5$.

In one embodiment, the equipment cooling module 1 may have at least some dimensions that are similar (or the same) as the rack cooling module in order to promote coupling between the two modules. For example, the width of the conducting structure, $W_1$, may be the same or less than $W_3$ of opening 48. In addition, the width of the conducting opening, $W_2$, may be the same (or less than) $W_4$ of the leak detection channel opening 58. In addition, a width between the flange 15 and the conducting structure may be the same or less than $W_5$. In one embodiment, the conductor opening 13 may be the same or less than $W_5$. In addition, the length, $L_2$, of the conducting structure may be the same or less than $L_4$ of the receiving channel 59. As described herein, these dimensions allow the equipment cooling module to be coupled to the rack cooling module.

Returning to stages 70 and 71, the first stage 70 shows the equipment cooling module being positioned in front of the rack cooling module. Specifically, this stage shows that the equipment cooling module is being aligned such that the supply and return connectors 10 and 11 are in front of manifold connectors 46 and 47, respectively, while the conducting structure 18 is in front of opening 48. Stage 71 shows the result of the equipment cooling module 1 being moved towards and coupled to the rack cooling module. Specifically, as shown, the manifold connectors 46 and 47 have been received by the connector opening 13 and coupled to the equipment cooling module's connectors. In addition, the conducting structure 18 has been received by the receiving channel 59, through opening 48, such that the conducting opening 14 is next to (or is abutting) the leak detection channel opening 58. Thus, when coupled, the rack cooling module may circulate liquid coolant through (e.g., the liquid cooling components of) the equipment cooling module, while in addition the conducting structure opening 14 may open into the leak detection channel 49 in order to guide any leaking liquid from within the equipment cooling module into the channel 49.

In one embodiment, the equipment cooling module and rack cooling module are dimensioned, as described herein, such that when both modules are coupled the sides of the modules are flush (or abut) one another. For example, as shown, the conducting structure 18 is fully received by the receiving channel, while the manifold section is fitted into the recessed portion of the server cooling module, such that the front side of the connector opening 13 comes into contact with a front side of the manifold section. In addition, a side of the flange 15 abuts the side of the manifold section that is opposite to the detection section. In one embodiment, the equipment cooling module may be tightly coupled to the rack cooling module in order to prevent liquid from leaking out between the sides of the modules.

In one embodiment, the flange may be arranged to couple the equipment cooling module 1 to the rack cooling module. Specifically, the flange may include one or more fasteners (not shown), which when the equipment cooling module is coupled to the rack cooling module may be fastened to one or more fasteners of the manifold section. In another aspect, the length, $L_3$ of the flange may be equal to or greater than a length of the (e.g., manifold section 42 of the) rack cooling module. As a result, the flange may extend beyond the rack cooling module in order for the flange to couple to another component, such as a housing of the electronics rack. As a result, the equipment cooling module may be coupled to the rack cooling module, while being fastened to the electronics rack in order to provide more stability.

Figure 7:
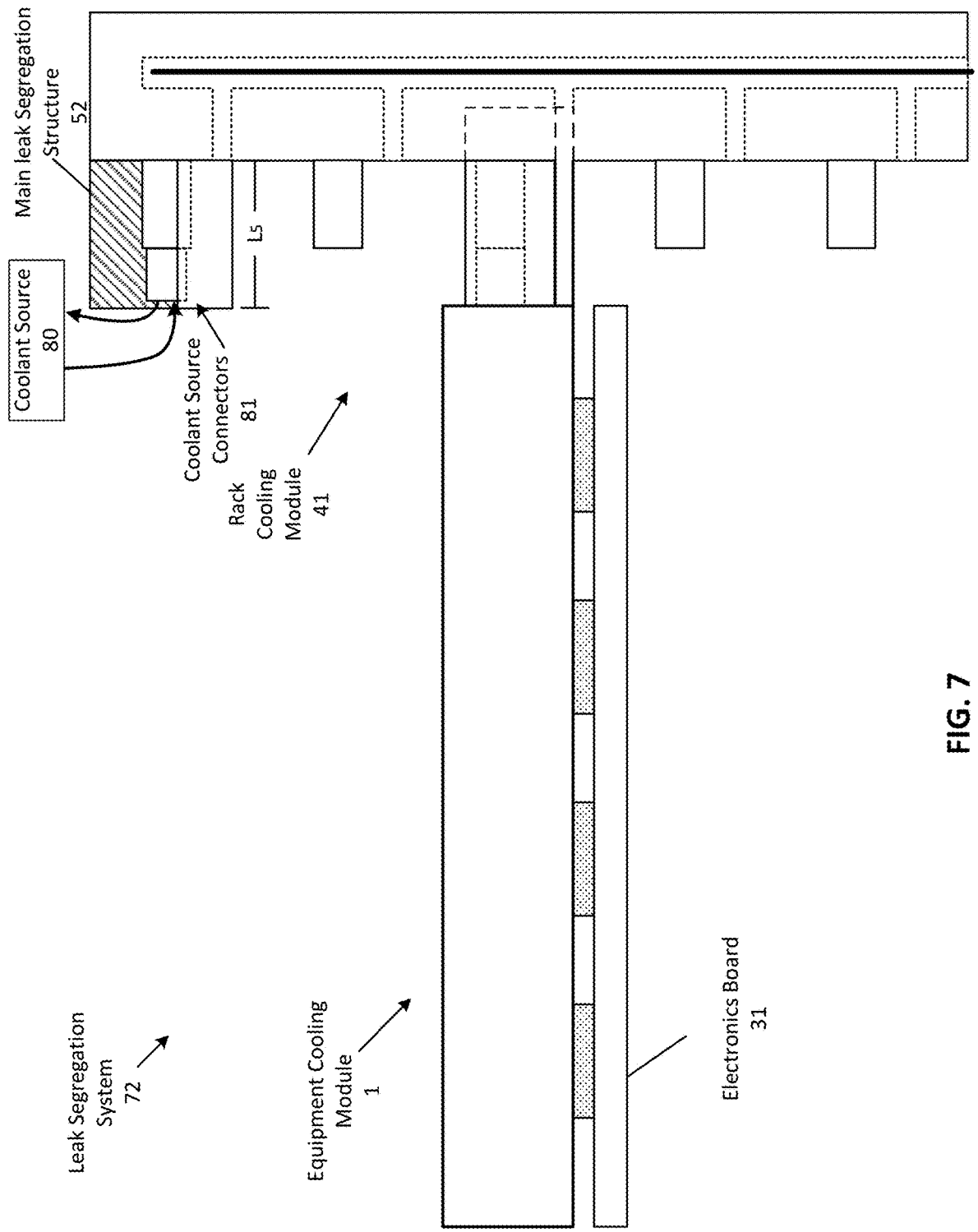
FIG. 7 shows a side view of the equipment cooling module coupled to the rack cooling module according to one embodiment.

FIG. 7 shows a side view of the leak segregation (and detection) system 72 that includes equipment cooling module 1 coupled to the rack cooling module 41 according to one embodiment. As shown, along with being coupled to the rack cooling module, the equipment cooling module is also coupled to (or mounted on) the electronics board 31. Thus, as described herein, the one or more cold plates of the equipment cooling module may draw heat away from the electronics board while the electronics board (and at least one IT component mounted thereon) is in operation, and transfer the heat into liquid coolant that is circulating through the cooling module.

This figure also shows a coolant source 80 that is coupled to the rack cooling module 41. In one embodiment, the coolant source may an IT liquid cooling water system or any type of cooling fluid source. In another embodiment, the coolant source may be a source that is separate from the electronics rack, or may be a source within the rack. For example, the coolant source may be a heat exchanger that is mounted within the electronics rack, such as heat exchanger 513 in FIG. 9.

In addition, this figure shows that the coolant source is coupled via coolant source connectors (e.g., supply and return connectors) 81 to the main supply and return connectors 44 and 45. As shown, the main leak segregation structure 52 extends forward from a front surface of the rack cooling module 41 and contains both pairs of connectors. Specifically, the (e.g., liquid path 90 and/or the sides 91-93 of the) leak segregation structure has a length, $L_5$, that is greater than (or equal to) a length of the main connectors and the connectors 81, while both pairs of connectors are coupled to each other. Thus, by extending beyond the combined lengths of the two pairs of coupled connectors, the main leak segregation structure may contain any liquid that may leak from the connectors (e.g., liquid that may leak at the connection of the connectors, and/or liquid that may leak from a line or tube that is coupled to the coolant source connectors 81, etc.).

In one embodiment, any of the connectors described thus far may be any type of connector arranged (or designed) to removably couple to other connectors. For example, the connectors may be any type of liquid connectors, which when two connectors are coupled together liquid may flow between the connectors. In some embodiments, at least some of the connectors may be dripless blind mating quick disconnects.

As described thus far, the equipment cooling module may have a pair of supply and return connectors (e.g., connectors 10 and 11), while the rack cooling module may also have a pair of respective supply and return manifold connectors (e.g., connectors 46 and 47). In one embodiment, either of the modules may have more or less supply and/or return connectors. For example, the equipment cooling module may have two pairs of supply and return connectors, which may allow the module to have two separate (e.g., one being redundant) heat exchanging loops). As a result, the equipment cooling module may be arranged to couple to two pairs of supply manifold connectors.

In one embodiment, the leak segregation system 72 may be a single-phase liquid cooling system in which liquid coolant (which may be a single-phase liquid coolant) that the rack cooling module circulates through the equipment cooling module may does not boil or undergo a phase change as the equipment cooling module transfers heat away from the electronics board and into the liquid coolant. In another embodiment, the system 72 may be a phase-change cooling system, in which liquid the cold plates of the equipment cooling module produces vapor from the liquid coolant when heat generated by (e.g., the IT components of) the electronics board is transferred into the liquid coolant by the cold plate. In which case, the vapor may be then returned to the coolant source, which may condense the vapor back into liquid coolant, which is then fed back into the equipment cooling module by the rack cooling module.

As described thus far, the detection section 43 of the rack cooling module 41 may include a leak detection cable 50 that is designed to detect a presence of liquid (e.g., when the liquid is in contact with the cable). In one embodiment, although the cable may detect the presence of liquid, the cable may be unable to determine at what location along the cable the liquid is present. For example, referring to FIG. 5, when liquid flows into the leak detection channel opening 58 through the main receiving channel 57, the leak detection cable 50 may detect the presence of liquid, but be unable to indicate that the liquid has been detected near or at the leak detection channel associated with the main receiving channel 57.

Figure 8:
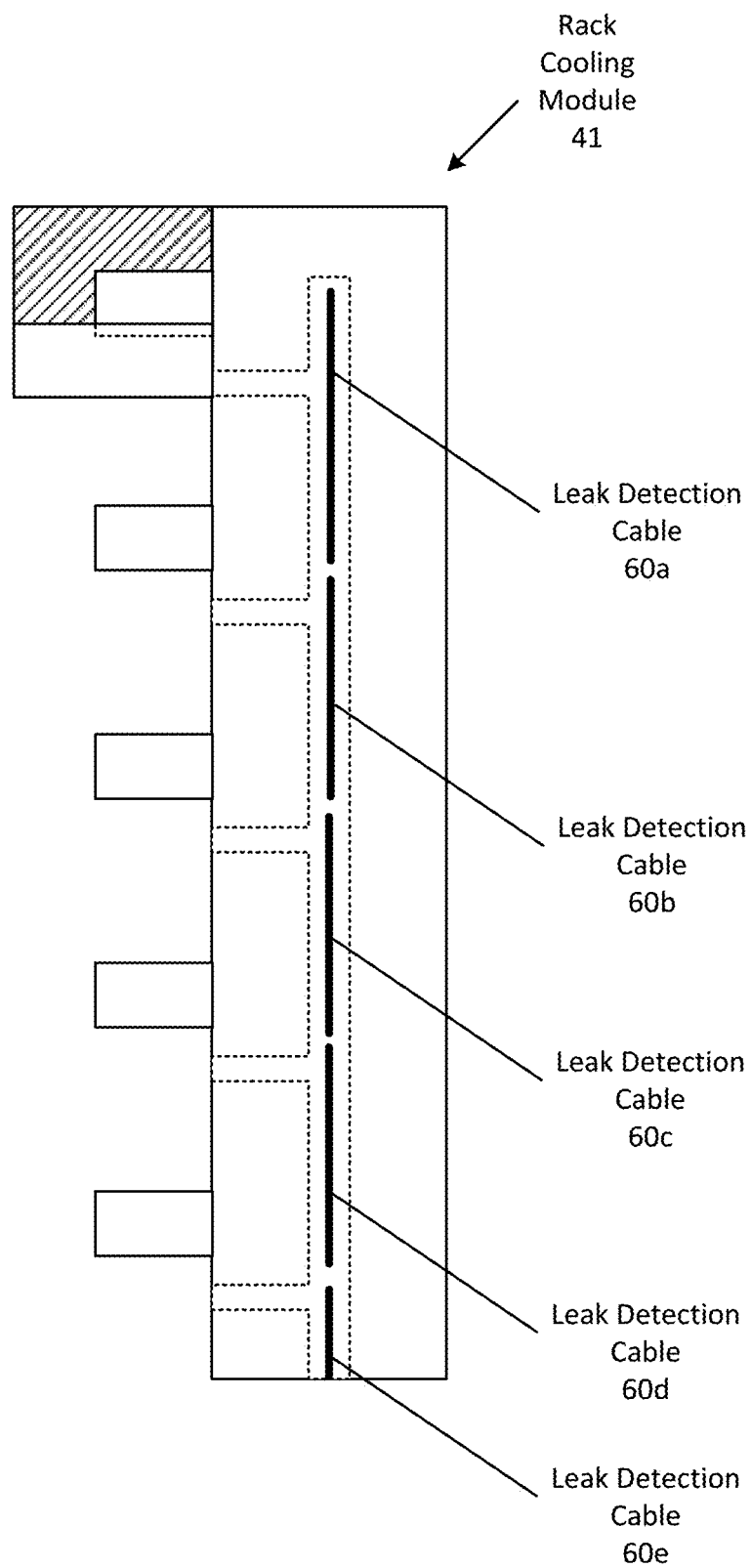
FIG. 8 shows a side view of the rack cooling module according to one embodiment.

In one embodiment, the rack cooling module 41 may be arranged to not only detect the presence of liquid but also determine where the liquid is coming from (or more specifically determine from which leak detection channel opening 58 the liquid is flowing through and into the leak detection channel). FIG. 8 shows an example of such an embodiment. In particular, this figure is showing a side view of the rack cooling module that includes several leak detection cables 60a-60e, where each cable is associated with a respective opening of the openings (e.g., openings 48 and the main segregation structure opening 53) of the rack cooling module and is arranged to detect the presence of liquid that flows into the leak detection channel 49 through the respective opening. In one embodiment, the leak detection cables may be communicatively coupled to the leak detection sensor 51, which may produce a control signal that indicates a presence of liquid and indicates at which opening the liquid is flowing from based on which leak detection cables the liquid comes into contact. In another embodiment, each of the separate cables may be communicatively coupled to a separate leak detection sensor.

As described thus far, the leak segregation and detection system 72 is arranged to segregate or (contain) leaking liquid within the system and to detect the presence of liquid. By segregating the liquid within the system, the electronics rack may continue to operate (e.g., by providing liquid cooling). For instance, the system may continue to circulate liquid coolant through equipment cooling modules, while any leaking liquid may be contained within the system (e.g., stored within the leak detection channel). In one embodiment, the rack cooling module may include a reservoir that is coupled to the leak detection channel. Thus, once a leak occurs, liquid may travel through the leak detection channel (making contact with the leak detection cable), and be stored within the reservoir. In another embodiment, the rack cooling module may have an outlet (e.g., at a bottom of the rack cooling module) through which liquid may be guided out of (e.g., and into a drain in a data center room in which the electronics rack is contained).

FIG. 9 is an example of an electronics rack that includes a leak segregation and detection system, such as system 72, according to one embodiment. Electronics rack 500 may include one or more server slots to contain one or more electronics boards, such as servers, respectively. In one embodiment, each server includes one or more IT components (e.g., processors, memory, storage devices, network interfaces). According to one embodiment, electronics rack 500 includes, but is not limited to, CDU 523, rack management unit (RMU) 502 (optional), a power supply unit (PSU) 550, and one or more electronics boards (or IT equipment) 507a-507d, which may be any type of IT equipment, such as server blades. The IT equipment 507 can be inserted into an array of server slots respectively from frontend 503 or backend 504 of electronics rack 500. In one aspect, the electronics boards 507a-507d may be the same as the electronics board 31, as shown in FIG. 3, for example.

Note that although there are only four electronics boards 507a-507d shown here, more or fewer electronics boards may be maintained within electronics rack 500. Also note that the particular positions of CDU 523, RMU 502, PSU 550, and IT equipment 507 are shown for the purpose of illustration only; other arrangements or configurations of these components. may also be implemented. Note that electronics rack 500 can be either open to the environment or partially contained by a rack container, as long as the cooling fans can generate airflows from the frontend to the backend (or generate airflows from the backend to the frontend).

As described herein, the electronics rack includes the leak segregation system 72. Specifically, the electronics rack 500 includes (e.g., contained within) the rack cooling module 41 and four equipment cooling modules 1a-1d that are coupled to the rack cooling module. In addition, each cooling module is coupled to (or mounted on) a respective electronics board. As a result, each equipment cooling module may liquid cool its respective electronics board, while any leaking liquid is segregated from a remainder of the electronics rack. For instance, if a leak were to occur in the equipment cooling module 1a, the leak segregation system segregates the leak such that the remainder of the electronics boards 507b-507d are unaffected by the leak.

In addition, a fan module can be associated with each of the electronics boards 507, and the PSU module. In this embodiment, fan modules 531a-531e, collectively referred to as fan modules 531, and are associated with the electronics boards 507a-507d and the PSU, respectively. Each of the fan modules 531 includes one or more cooling fans. Fan modules 531 may be mounted on the backends of IT equipment 507 to generate airflows flowing from frontend 503, traveling through the rack 500, and existing at backend 504 of electronics rack 500. In another embodiment, one or more of the fan modules may be positioned on the frontend 503 of the rack 500. Such frontend fans may be configured to push air into the mounted equipment.

In one embodiment, CDU 523 mainly includes heat exchanger 513, liquid pump 514, and a pump controller (not shown), and some other components such as a liquid reservoir, a power supply, monitoring sensors and so on. Note that CDUs 501 can be any kind of CDUs commercially available or customized ones. Thus, the details of CDUs 523 will not be described herein. Heat exchanger 513 may be a liquid-to-liquid heat exchanger. As shown, the heat exchanger 513 is fluidly coupled to the main supply and return connectors 44 and 45 in order to cool circulating liquid coolant within the rack cooling module. As described herein, the rack cooling module may include one or more leak detection sensors 51. In one embodiment, at least some sensors may be communicatively coupled to equipment within the electronics rack, which may be configured to perform liquid detection operations. For example, the sensors may be communicatively coupled with the CDU, which when receiving a control signal from the sensor that indicates a leak may perform one or more operations. For instance, the CDU may produce an alert (e.g., via a computer terminal) that indicates that a leak is present within the rack cooling module and may accurately report which electronics rack and/or at which equipment cooling module a leak has occurred. In another embodiment, the leak detection sensor may be communicatively coupled with any electronics boards 507 or a controller (not shown) of the electronics rack that is configured to perform leak detection operations.

In another embodiment, the flow of liquid into one or more equipment cooling modules may be adjusted based on a detected leak. For example, the rack cooling module may include one or more components that are designed to control the flow of liquid, such as one or more valves. In which case, each manifold connector may be coupled to a valve. Thus, in response to detecting a leak (e.g., at a particular opening 48), the electronics rack may be configured to close values of manifold connectors that are associated with the leak (e.g., associated with the opening at which the leak was detected).

Each of the electronics boards 507 include one or more IT components (e.g., IT components 30, as shown in FIG. 3), such as central processing units or CPUs, graphical processing units (GPUs), memory, and/or storage devices, for example. Each IT component may perform data processing tasks, where the IT component may include software installed in a storage device, loaded into the memory, and executed by one or more processors to perform the data processing tasks. At least some of these IT components may be attached to the bottom of any of the cooling devices as described above. IT equipment 507 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Electronics rack 500 further includes optional RMU 502 configured to provide and manage power supplied to servers 507, fan modules 531, and CDU 523. Optimization module 521 and RMC 505 can communicate with a controller in some of the applications. RMU 502 may be coupled to PSU 550 to manage the power consumption of the PSU. The PSU 550 may include the necessary circuitry (e.g., an alternating current (AC) to direct current (DC) or DC to DC power converter, backup battery, transformer, or regulator, etc.) to provide power to the rest of the components of electronics rack 500.

In one embodiment, the (e.g., PSU 550 of the) electronics rack 500 may draw power from the AC mains to power electronics mounted therein. In another embodiment, the rack may draw power from one or more renewable power sources, such as a photovoltaic (PV) power system. In this case, the electronics rack may draw power from one or more renewable energy sources (e.g., PV systems), and supply the electronics boards 507 and/or other components of the electronics rack cooling capabilities and/or perform leak detection operations, as described herein. In one embodiment, the PSU may be electrically coupled to any type of power source.

In one embodiment, RMU 502 includes optimization module 521 and rack management controller (RMC) 505. RMC 505 may include a monitor to monitor operating status of various components within electronics rack 500, such as, for example, the electronics boards 507, CDU 523, and fan modules 531. Specifically, the monitor receives operating data from various sensors representing the operating environments of electronics rack 500. For example, the monitor may receive operating data representing temperatures of the processors, cooling liquid, and airflows, which may be captured and collected via various temperature sensors. The monitor may also receive data representing the fan power and pump power generated by the fan modules 531 and liquid pump 514, which may be proportional to their respective speeds. These operating data are referred to as real-time operating data. Note that the monitor may be implemented as a separate module within RMU 502.

Based on the operating data, optimization module 521 performs an optimization using a predetermined optimization function or optimization model to derive a set of optimal fan speeds for fan modules 531 and an optimal pump speed for liquid pump 514, such that the total power consumption of liquid pump 514 and fan modules 531 reaches minimum, while the operating data associated with liquid pump 514 and cooling fans of fan modules 531 are within their respective designed specifications. Once the optimal pump speed and optimal fan speeds have been determined, RMC 505 configures liquid pump 514 and cooling fans of fan modules 531 based on the optimal pump speed and fan speeds.

As an example, based on the optimal pump speed, RMC 505 communicates with a pump controller of CDU 523 to control the speed of liquid pump 514, which in turn controls a liquid flow rate of cooling liquid supplied to the supply rack distribution manifold of the rack cooling module to be distributed to at least some of server blades 507. Therefore, the operating condition and the corresponding cooling device performance are adjusted. Similarly, based on the optimal fan speeds, RMC 505 communicates with each of the fan modules 531 to control the speed of each cooling fan of the fan modules 531, which in turn control the airflow rates of the fan modules 531. Note that each of fan modules 531 may be individually controlled with its specific optimal fan speed, and different fan modules and/or different cooling fans within the same fan module may have different optimal fan speeds.

Note that some or all of the IT equipment 507 may utilize different cooling methods. For instance, one server may utilize air cooling while another server may utilize liquid cooling. Alternatively, one IT component of a server may utilize air cooling while another IT component of the same server may utilize liquid cooling. In another embodiment, at least one of the electronics boards may be cooled by utilizing one or more TEC elements, as described herein.

As previously explained, an embodiment of the disclosure may be (or include) a non-transitory machine-readable medium (such as microelectronic memory) having stored thereon instructions, which program one or more data processing components (generically referred to here as a "processor") to perform liquid detection operations, as described herein. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain embodiments have been described and shown in the accompanying drawings, it is to be understood that such embodiments are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some embodiments, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some embodiments, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. An equipment cooling module comprising:
  a leak segregation chassis that includes
    a supply connector, a return connector, and a conducting path that are contained within an interior of the leak segregation chassis,
    a first opening that is arranged to receive a supply manifold connector and a return manifold connector for coupling to the supply connector and the return connector, respectively,
    a second opening, wherein the conducting path extends from the interior of the leak segregation chassis to the second opening and is arranged to guide liquid from the interior of the leak segregation chassis to and out of the second opening;

a conducting structure that includes the conducting path and the second opening, and is on a first side of the first opening; and
a flange that is on a second side of the first opening that is opposite to the first side; and
a cooling chassis that is coupled to the leak segregation chassis, and includes a cold plate that is contained within an interior of the cooling chassis, wherein the cold plate is arranged to couple with an information technology (IT) component of an electronics board, and is coupled to the supply connector and to the return connector.

2. The equipment cooling module of claim 1, wherein the conducting path tapers from a surface of the interior of the leak segregation chassis towards the second opening.

3. The equipment cooling module of claim 1, wherein the leak segregation chassis and the cooling chassis are one integrated unit.

4. The equipment cooling module of claim 1, further comprising an interior opening that couples the interior of the cooling chassis to the interior of the leak segregation chassis such that liquid flows from the cooling chassis into the leak segregation chassis, wherein the first and second openings are the only openings into the equipment cooling module.

5. The equipment cooling module of claim 1, wherein the cold plate is one of a plurality of cold plates, wherein the cooling chassis further includes a supply distribution manifold, a return distribution manifold, and the plurality of cold plates contained therein,
wherein the supply distribution manifold couples the plurality of cold plates to the supply connector to supply liquid coolant from a coolant source, and the return distribution manifold couples the plurality of cold plates to the return connector to return warmed liquid coolant from the plurality of cold plates to the coolant source.

6. The equipment cooling module of claim 1,
wherein the first opening is recessed between the flange and the conducting structure.

7. The equipment cooling module of claim 6, wherein the conducting structure has a first length that extends beyond the first opening and the flange has a second length that extends beyond the first opening, wherein the first length is greater than the second length.

8. A rack cooling module for an electronics rack, comprising:
a manifold section that includes
a main supply connector and a main return connector that are arranged to couple to a coolant source, and
a plurality of pairs of supply and return connectors positioned below a main leak segregation structure and are arranged in a stack, the plurality of pairs of supply and return connectors including a pair of supply and return connectors that are positioned below the main supply and return connectors, the supply connector is coupled to the main supply connector for receiving liquid coolant from the coolant source and the return connector is coupled to the main return connector for returning liquid coolant to the coolant source, wherein the pair is arranged to couple to a cold plate that is arranged to draw heat away from an information technology (IT) component;
a detection section that is adjacent to the manifold section and includes a channel that extends vertically within the detection section, the channel comprising a leak detection cable,
a plurality of openings into the channel, each of the plurality of opening associated with and adjacent to a corresponding pair of the plurality of pairs, the plurality of openings including an opening into the channel; and
a main leak segregation structure that is positioned between the main supply and return connectors and the one pair of supply and return connectors and at least partially contains the main supply and return connectors, the main leak segregation structure having a liquid path to the opening of the detection section and is arranged to allow liquid to flow into the channel via the opening.

9. The rack cooling module of claim 8, wherein the leak detection cable is arranged in the channel to detect a presence of liquid that flows into the channel from the opening, wherein the detection section comprises a plurality of leak detection cables, each cable associated with a respective opening of the plurality of openings and is arranged to detect the presence of liquid that flows into the channel through the respective opening.

10. The rack cooling module of claim 8, wherein each opening is positioned below its respective pair of supply and return connectors along a vertical axis.

11. The rack cooling module of claim 8, wherein the plurality of openings is a first plurality of openings and the channel comprises a second plurality of openings, wherein the rack cooling module further comprises a plurality of receiving channels, each receiving channel coupling one opening of the first plurality of openings to one opening of the second plurality of openings.

12. The rack cooling module of claim 11, wherein each of the plurality of first openings has a first width along a horizontal axis and each of the plurality of second openings has a second width along the horizontal axis that is narrower than the first width.

13. The rack cooling module of claim 8, wherein the main leak segregation structure comprises at least three elevated sides that surround the main supply and return connectors and the opening of the detection section.

14. A leak segregation and detection system for an electronics rack, the system comprising:
a rack cooling module that includes:
a fluid manifold section that has
a main supply connector and a main return connector, and
a pair of supply and return manifold connectors that are positioned below the main supply and return connectors to which the supply and return manifold connectors are coupled, respectively, and
a detection section that includes a channel that extends vertically that has a leak detection cable contained therein,
a main leak segregation structure that is positioned between the main supply and return connectors and the pair of supply and return manifold connectors, and at least partially contains the main supply and return connectors, the main leak segregation structure having a liquid path to the channel and is arranged to guide liquid into the channel; and
an equipment cooling module that includes:
a leak segregation chassis that has a pair of supply and return connectors and a conducting path that are contained within an interior of the leak segregation chassis,
a first opening,
a second opening, wherein the conducting path extends from the interior of the leak segregation chassis to the second opening,
a conducting structure that includes the conducting path and the second opening, and is on a first side of the first opening; and
a flange that is on a second side of the first opening that is opposite to the first side; and
a cooling chassis that includes a cold plate that is arranged to couple with an information technology (IT) component of an electronics board, and is coupled to the supply and return connectors,
wherein the equipment cooling module is arranged to couple to the rack cooling module such that the pair of supply and return liquid manifold connectors are received through the first opening and couple to the pair of supply and return connectors.

15. The leak segregation and detection system of claim 14,
wherein the first opening is recessed between the flange and the conducting structure.

16. The leak segregation and detection system of claim 15,
wherein the detection section comprises a receiving channel that opens into the channel,
wherein equipment cooling module is arranged to couple to the rack cooling module such that the first opening receives the pair of supply and return liquid manifold connectors and the receiving channel receives the conducting structure,
wherein upon the receiving channel receiving the conducting structure the second opening opens into the channel of the detection section.

17. The leak segregation and detection system of claim 15, wherein the conducting structure has a first length that extends beyond the first opening and the flange has a second length that extends beyond the first opening, wherein the first length is greater than the second length.

18. The leak segregation and detection system of claim 14,
wherein the fluid manifold comprises a plurality of pairs of supply and return manifold connectors that are positioned below the main leak segregation structure and are arranged in a stack,
wherein the detection section comprises a plurality of openings into the channel that are positioned below the main leak segregation structure, each of the plurality of opening associated with and adjacent to a corresponding pair of the plurality of pairs,
wherein each pair of supply and return manifold connectors and associated opening in the detection section are arranged to couple to a different equipment cooling module.

19. The leak segregation and detection system of claim 14, wherein the main leak segregation structure comprises at least three elevated sides that surround the main supply and return connectors and a third opening into the channel of the detection section.

\* \* \* \* \*